United States Patent
Karras et al.

(10) Patent No.: US 12,210,057 B2
(45) Date of Patent: Jan. 28, 2025

(54) WAFER-LEVEL TEST METHOD FOR OPTOELECTRONIC CHIPS

(71) Applicant: JENOPTIK Optical Systems GmbH, Jena (DE)

(72) Inventors: Christian Karras, Jena (DE); Tobias Gnausch, Jena (DE); Robert Buettner, Jena (DE); Kay Reetz, Weimar (DE); Armin Grundmann, Jena (DE); Thomas Kaden, Dresden (DE)

(73) Assignee: Jenoptik Optical Systems GmbH, Jena (DE)

( * ) Notice: Subject to any disclaimer, the term of this patent is extended or adjusted under 35 U.S.C. 154(b) by 0 days.

(21) Appl. No.: 18/287,141

(22) PCT Filed: Apr. 12, 2022

(86) PCT No.: PCT/EP2022/059758
§ 371 (c)(1),
(2) Date: Oct. 16, 2023

(87) PCT Pub. No.: WO2022/218983
PCT Pub. Date: Oct. 20, 2022

(65) Prior Publication Data
US 2024/0369624 A1    Nov. 7, 2024

(30) Foreign Application Priority Data

Apr. 16, 2021   (DE) .................... 10 2021 109 605.7
Apr. 21, 2021   (DE) .................... 10 2021 110 102.6

(51) Int. Cl.
*G01R 31/28*   (2006.01)
*G01R 31/311*  (2006.01)

(52) U.S. Cl.
CPC ........ *G01R 31/2891* (2013.01); *G01R 31/311* (2013.01)

(58) Field of Classification Search
CPC .... G01R 31/265; G01R 31/28; G01R 31/311; G01R 1/073; G01R 31/2891; H01L 21/66; H01L 31/10; H01L 33/00; H01S 5/0014

(Continued)

(56) References Cited

U.S. PATENT DOCUMENTS 7,378,861 B1    5/2008  Malendevich et al.
7,412,138 B1 *  8/2008  Malendevich ........... G02B 6/34
                                                            385/52

(Continued)

FOREIGN PATENT DOCUMENTS

DE    10 2013 223 034 A1    5/2015
DE    10 2018 108 283 A1   10/2019

(Continued)

OTHER PUBLICATIONS

DeCoster et al., "Test-station for flexible semi-automatic wafer-level silicon photonics testing," 21st IEEE Eur Test Symp (ETS), pp. 1-6 (May 23, 2016).

*Primary Examiner* — Eman A Alkafawi
*Assistant Examiner* — Courtney G McDonnough
(74) *Attorney, Agent, or Firm* — Muncy, Geissler, Olds & Lowe, P.C.

(57) ABSTRACT

A method for testing optoelectronic chips that are arranged on a wafer and comprise electric interfaces in the form of contact pads and optical interfaces, which are arranged in a fixed manner relative to the electric interfaces, in the form of optical deflecting elements, e.g. grating couplers, at a specified coupling angle. In the process, the wafer is adjusted in three adjustment steps in such a manner that one of the chips is positioned relative to a contacting module such that the electric interfaces of the chip and the contacting module are in contact with one another and the optical (Continued)

Figure 1A:
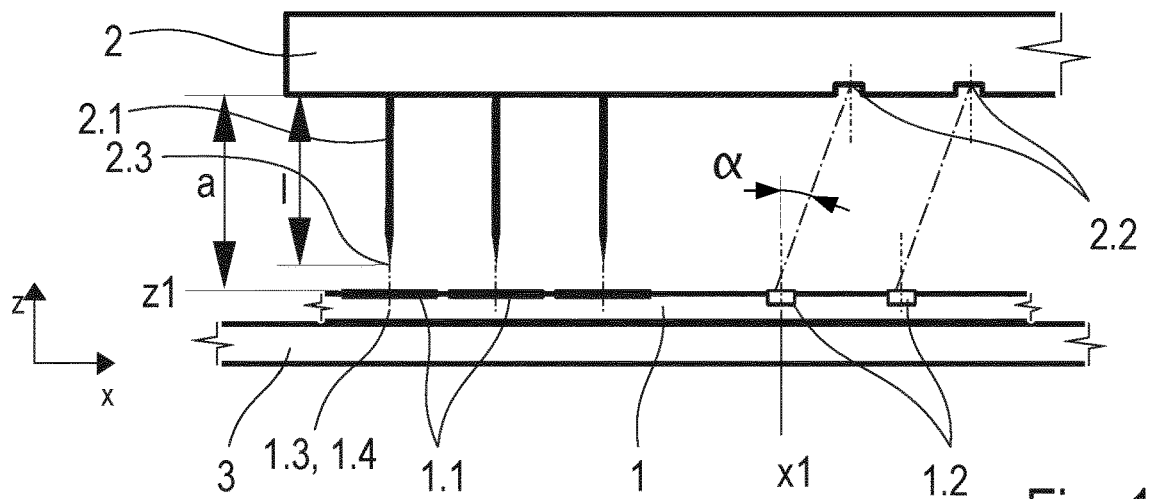

interfaces of the chip and the contacting module assume a maximum position of the optical coupling.

11 Claims, 4 Drawing Sheets

(58) Field of Classification Search
USPC .................................................. 324/750.16
See application file for complete search history.

(56) References Cited

U.S. PATENT DOCUMENTS

| | | |
|---|---|---|
| 11,480,495 B2 | 10/2022 | Gnausch et al. |
| 2021/0033643 A1 | 2/2021 | Huebner et al. |
| 2021/0096176 A1 | 4/2021 | Frankel et al. |
| 2022/0034959 A1* | 2/2022 | Arai ...................... G01M 11/00 |
| 2022/0397602 A1 | 12/2022 | Gnausch et al. |

FOREIGN PATENT DOCUMENTS

| | | |
|---|---|---|
| WO | WO 2019/029765 A1 | 2/2019 |
| WO | WO 2021/078318 A1 | 4/2021 |

* cited by examiner

WAFER-LEVEL TEST METHOD FOR OPTOELECTRONIC CHIPS

TECHNICAL FIELD

The invention relates to a method that can be used to simultaneously test the functionality of electrical and optical components or circuits of a chip at wafer level in a wafer prober. A generic such method is known from US 2011/0279812 A1.

The invention is found in the field of testing and qualifying chips with optical-electrical integrated circuits, so-called PICs (photonic integrated circuits), at wafer level. In contrast to conventional, purely electrically integrated circuits, which are known as ICs (integrated circuits), optical functionalities are also integrated in PICs, in addition to the electrical circuits.

Various production steps in the production of ICs, for example by means of CMOS technology, include testing and measuring, firstly for monitoring the process and secondly for carrying out quality control. In this context, the electrical wafer level test, which follows the completion of the wafer, is an established test. In this case, functional and non-functional chips are determined and recorded in a wafer map, and this is used to determine the yield. Functional chips are also referred to as known good dies (KGD). Then, the non-functional chips are removed during the singulation of the wafer into individual chips. The test apparatus required for the wafer level test is available in the form of wafer probers and wafer testers with associated contacting modules (also referred to as probe cards). The contacting module is used to connect the device-side interfaces of the wafer tester to the individual interfaces of the chips of the wafer which has been fastened to the wafer prober. In principle, the contacting module can be configured such that it contacts only a single chip or else a plurality of chips at the same time. However, it is not mandatory for the chips to still be present on the wafer for contacting purposes. All that is required for the purpose of contacting the chips of a wafer a plurality at a time, or else in succession, is that the chips have a fixed and defined position relative to one another.

Test apparatuses for testing purely electronic chips (semiconductor chip with ICs) have been optimized and diversified for decades in order to be able to qualify high volumes of very different ICs with a high throughput, for the purpose of optimizing costs.

As a rule, PICs are produced using the same established semiconductor processes, for example CMOS technology. The manufacturing volumes of PICs, which to date have been very low in comparison with IC production, generally lead to tests for process characterization only, and no functional tests of the PICs, being carried out in the semiconductor plant. The functional characterization is a task for the customer and is often carried out on sawed chips. The utilized test apparatus uses mutually independent, separate electrical and optical contacting modules and is not optimized for throughput.

PRIOR ART

Wafer level testing of PICs requires input and output coupling of light into and from the PIC level, respectively, generally by means of integrated grating couplers as coupling points, as described in the relevant literature: "Grating Couplers for Coupling between Optical Fibers and Nanophotonic Waveguides" (D. Taillaert et al, Japanese Journal of Applied Phys[i]cs, vol. 45, no. 8A, 2006, pp. 6071-6077). The grating couplers can be functional components in the chip or sacrificial structures on the wafer, for example in the scribe lines or on adjacent chips.

According to the prior art, optical fiber-based systems are used for the wafer level test, as described in the relevant literature: "Test-station for flexible semi-automatic wafer-level silicon photonics testing" (J. De Coster et al, 21th IEEE European Test Symposium, ETS 2016, Amsterdam, Netherlands, May 23-27, 2016. IEEE 2016, ISBN 978-1-4673-9659-2). These contain an optical fiber-based optics module, which input and output couples light into the coupling points of the chip via individual optical fibers. To ensure repeatable optical coupling, the optical fibers must be aligned with the coupling points at a distance of up to a few micrometers with sub-micrometer accuracy. This is only possible with the aid of very precise actuators, for example in the combination of hexapods with piezo elements. Then again, each individual optical coupling must be preceded by a time-consuming and active alignment procedure, which is designed to attain maximum coupling efficiency.

Hence, existing wafer level test systems are characterized by sequential, time-consuming contacting of all optical coupling points of a chip in succession; that is to say, parallel contacting of all optical coupling points on a chip is not possible or only possible to a very restricted extent, and parallel contacting of a plurality of chips is not possible at all.

special device-side solutions, with the result that conventional wafer probers are only retrofittable with complicated and expensive modifications and, following the retrofit, are no longer usable, or only usable to a restricted extent, or only usable following a time-consuming retrofit, for the wafer level test of ICs.

separate electronics and optics modules that are not securely connected to one another, which is to say these have to be held and adjusted separately.

The aforementioned US 2006/0109015 A1 has disclosed an optoelectronic contacting module (probe module) for testing chips (object to be examined—DUT 140) with electrical and optical inputs and outputs. The contacting module represents an interface between a test apparatus (ATE) and the test object (device under test, abbreviated DUT) and is embodied with electrical contacts (electrical probes), optical contacts (optical probes), optical elements, and combinations thereof in order to transmit signals from the DUT and to the DUT and redistribute these signals for an interface to the test apparatus.

With regards to the optical inputs and outputs, there is disclosure that these are created by way of optical elements which are situated on the probe substrate and/or the redistribution substrate and which are calibrated to various input coupling mechanisms, for example free radiation, virtually free radiation, or waveguides. Diffractive elements and refractive elements are specified as optical elements suitable to this end. Additionally, it specifies that a photodetector or a light source may be arranged directly at the interface to the DUT, and these then represent the optical input or output on the probe substrate.

Moreover, the aforementioned US 2006/0109015 A1 teaches that the optical signal is focused or collimated for embodiments of the optical input coupling by way of free beam or virtually free beam links, in which the optical signal is guided through a free space between the optical element and the interface to the DUT, for the purpose of obtaining a high input coupling efficiency of the transferred signal.

Consequently, signal input coupling here is subject to the concept of input coupling the signal as completely as possible.

According to an exemplary embodiment in the aforementioned US 2006/0109015 A1, the optical and the electrical signal lines (optical and electrical distribution network) are embodied on separate redistribution substrates. It is proposed to guide the electrical signals from the DUT to the edge regions of the probe substrate such that, in the first redistribution substrate arranged above the probe substrate, the electrical signals are input coupled above the edge region. As a result, an opening can be formed in the first redistribution substrate, in which only the electrical signals are redistributed, and the optical signals are guided through said opening into a separate second redistribution substrate arranged thereabove.

In summary, the aforementioned US 2006/0109015 A1 highlights a number of ideas as to how a contacting module which, with reasons, has been subdivided into a probe substrate and a redistribution substrate, for example as a result of the wear of the mechanical contacts for the electrical signal transfer, could additionally be equipped with optical signal lines. In so doing, it completely ignores the fact that the tolerances possible for the mechanical contacting of the electrical inputs and outputs of the contacting module to the DUT cannot be transferred to the optical inputs and outputs.

While the transmission of an always unchanging electrical signal merely requires a mechanical contact of needles present on the contacting module with contact pads present on the DUT, which can be ensured within a comparatively large positional tolerance of a few μm in all three spatial directions, the quality of the optical signal transfer is already influenced in the case of a very much smaller deviation, in the sub-μm range, from a target position.

If, as described in the aforementioned US 2006/0109015 A1, there is an optimization of the coupling efficiency of the optical signal by way of a collimation or focusing of the optical beam, then the entire contacting module must be adjusted highly precisely in the sub-μm range. Otherwise, the alignment-dependent repeatability of the measurement is insufficient for the described applications. This in turn has the consequence that the contacting module cannot exploit the alignment tolerance of the order of the few micrometers in the X-, Y- and Z-directions, typical for conventional electrical wafer probers, for the electrical contacting. This requires complicated and expensive special wafer prober solutions, inter alia with various actuators, for example piezo actuators, and linear shafts or hexapods, in order to highly precisely align the contacting module with respect to the DUT.

A further critical point is that the clean electrical alignment of the needles requires setting a so-called overdrive of typically a few 10 μm in the Z-direction; i.e., the first contact of the needles with the electrical contact pads is followed by a further displacement of the contacting module by an additional value in the Z-direction in order to ensure reliable electrical contact. Wear and deformation of the needles are generally compensated for by an adjustment of the overdrive during the operation. However, in the case of simply collimating or focusing the optical beam, as described in the aforementioned US 2006/0109015 A1, the working distance in the Z-direction may only fluctuate in the micrometer range to ensure repeatable coupling. Hence, this type of optical coupling is not compatible with established electrical contacting methods.

US 2011/0279812 A1 discloses a contacting module for testing chips with electrical and optical inputs and outputs. The chip is accommodated on a movable carrier, by means of which it can be roughly aligned with the contacting module. The rough alignment is implemented under sensor control on the basis of a position of the chip being monitored or on the basis of the alignment marks on the chip. The chip is finely aligned in two method steps. Whether the electrical inputs and outputs are in contact with the contacting module is monitored in the first method step. To this end, the chip is suctioned with the contacting module, with the result that the electrical inputs and outputs of the chip come into contact with the electrical contacts of the contacting module. Successful contacting is verified by means of a test signal and, in the case of faulty contacting, this is corrected by means of a repeated rough alignment. In the second method step, there is the alignment at the optical inputs and outputs. The optical inputs and outputs of the chip can receive or transmit focused or collimated beams using an adjusted aperture and focal position. The optical inputs and outputs of the contacting module comprise variable optics by means of which it is possible to generate beams focused perpendicularly on the surface of the optical inputs and outputs, with the axial and lateral focal position and the aperture of the beams being adjustable. For adjustment purposes, the variable optics comprise at least one optical element with an adjustable focal length and/or at least one optical element which is movable. The axial adjustment of the focal position is implemented on the basis of distance measurements using additional distance sensors or on the basis of intensity measurements using an optical test signal. The lateral adjustment of the focal position is implemented on the basis of intensity measurements, within the scope of which a test beam already focused on the surface of the chip is moved vis-à-vis the optical inputs and outputs with a scanning relative motion until the test beam is optimally input coupled into the optical inputs and outputs. The time required to this end can be shortened by virtue of the scanning relative motion initially being carried out using an enlarged focal diameter of the test beam. The fine alignment is followed by the test of the chip by means of a specific electrical and optical test signal sequence, wherein parts of the rough and fine alignment can be stored and can be subsequently used within the scope of testing a plurality of similar chips.

DE 102018108283 A1 has disclosed an electro-optic printed circuit board for contacting photonic integrated circuits, in which an optical beam path is guided through the printed circuit board. A disadvantage is found in the low achievable precision of the optical coupling between the printed circuit board and the chip to be tested.

WO 2019/029765A1 has disclosed a position tolerance insensitive contacting module for contacting optoelectronic chips. A disadvantage is the fact that the alignment of the contacting module with respect to the chip to be tested can be suboptimal.

For wafer level testing of electronic chips, the determination of the spatial position of the tips of the needles by means of a first camera and the determination of the spatial position of the centers of the contact pads of a chip by means of a second camera is known from practice. A relative position of the tips from the contact pads derived therefrom is used to form control signals that are used to control the positioning stage and position the centers of the contact pads perpendicularly below the tips before the contact needles are brought into contact with the contact pads.

OBJECT OF THE INVENTION

It is the object of the invention to find a method for testing optoelectronic chips arranged on a wafer and having electrical interfaces in the form of contact pads and optical interfaces in the form of optical deflection elements which are fixedly arranged in relation to said electrical interfaces and which have a specific coupling angle, which method is based on methods for testing electronic chips that have proven their worth.

Achieving the Object

This object is achieved by a method according to claim 1 for testing optoelectronic chips arranged on a wafer and having electrical interfaces in the form of contact pads and optical interfaces in the form of optical deflection elements which are fixedly arranged in relation to said electrical interfaces.

Description

The method according to the invention serves to test optoelectronic chips arranged on a wafer.

The chips comprise electrical interfaces in the form of contact pads and optical elements which are fixedly arranged in relation thereto. For example, optical elements can be passive optical elements, optoelectronic actuators and/or optoelectronic sensors and/or electro-optic modulators. The optical elements comprise optical interfaces in the form of optical deflection elements with a specific coupling angle $\alpha$. For example, the deflection elements can be in the form of a grating couplers or mirrors. The specific coupling angle $\alpha$ may represent an angle which an optical signal or its central ray includes with a wafer normal. The normal can be the z-direction. The specific coupling angle can typically be greater than 0° and less than 25°. By way of example, a typical value for the specific coupling angle $\alpha$ can be 11.6° and can be advantageous for the optical fibers with a corresponding polished wedge section, which are used for coupling purposes in the final application of the chip. Advantageously, the rays deflected by a plurality of optical deflection elements, particularly advantageously from all optical deflection elements, may be parallel. Should the optical elements be designed for ray bundles, the parallelism can be determined in respect of the central rays of the ray bundles. Then, the coordinate system can be chosen so that the y-components of the deflected rays disappear, which is to say that the deflected rays can be located in the xz-planes.

In the method according to the invention, the wafer is accommodated by a positioning stage which is adjustable vis-à-vis a contacting module in the x-, y-, and z-direction of a Cartesian coordinate system and which is rotatable about the z-axis. The x- and y-coordinates can advantageously be adjusted by means of the positioning stage. The z-coordinates can advantageously also be adjusted by means of the positioning stage. As an alternative or in addition, the adjustability in the z-direction can be provided by means of a vertical lifting and lowering device of the contacting module. The rotatability about the z-axis may advantageously be provided by means of a rotatability of the positioning stage. As an alternative or in addition, the rotatability about the z-axis may be provided by means of a rotating device of the contacting module. The contacting module has electrical interfaces in the form of needles with needle tips assigned to the contact pads. Moreover, the contacting module has optical interfaces assigned to the optical deflection elements.

A possibly present deviation of the x-travel and/or y-travel of the positioning stage from the x-direction and/or y-direction of the chip can for example be counterbalanced by means of the aforementioned rotatability about the z-axis or compensated by means of a rotation matrix within the meaning of a rotation as a linear coordinates transformation (what is known as an alias transformation in the xy-plane) when controlling the travels of the positioning stage.

In a first alignment step, the wafer is moved toward the contacting module in such a way that the needle tips are arranged in a first position (x1, y1, z1), in each case with a spacing in the z-direction above a predetermined point of the assigned contact pad of a first of the chips, the contacting module being at a first distance a from the first chip in the z-direction. In this case, the first distance a is greater than a maximum distance 1 of the needle tips from the contacting module. The maximum distance of the needle tips from the contacting module can also be considered to be an effective needle length in the z-direction in the mechanically unloaded (i.e., force-free) state. The predetermined point can be a certain xy-position, which is to say a point in an xy-plane. The predetermined point can, but need not, be the center of the contact pad. By way of example, the needles can be in the form of perpendicular needles (i.e., needles arranged in the z-direction), so-called "vertical needles", which have only a small spring effect under certain circumstances. Advantageously, the needles can be in the form of deflectable perpendicular or obliquely arranged needles. The needles can particularly advantageously be in the form of cantilever needles. Cantilever needles can be those needles which are resiliently arranged within the meaning of a cantilever. Preferably, cantilever needles can be arranged such that, in relation to their cantilever portion, they include an angle of greater than 60°, particularly preferably greater than 70°, and very particularly preferably greater than 80° with respect to the z-axis in the unloaded (force-free) state. By way of example, the first alignment step can be carried out by means of one or more cameras, with the aid of which the first position can be found. As an alternative, there can also be manual positioning or passive positioning by way of abutting the wafer edge against provided stops.

Proceeding from the first position (x1, y1, z1), a second position (x2, y2, z2) is determined in a second alignment step by virtue of the positioning stage being moved toward the contacting module at a second distance b in the z-direction, in which the needle tips abut against the contact pads such that electrical signals are transferable via the respective interfaces assigned to one another and optical signals are transferable via the respective optical interfaces assigned to one another. According to the invention, a relative alignment of the optical deflection elements with respect to the optical interfaces present on the contacting module is implemented in the second alignment step by virtue of, in a scanning field smaller than an xy-extent of the contact pads, the positioning stage being deflected in the x- and/or y-direction with respect to the x- and/or y-coordinates of the first position and/or being moved in the z-direction toward scanning positions (xs[i], ys[i], zs[i]) within a scanning region, and an optical signal being coupled at the scanning positions P[i] =(xs[i], ys[i], zs[i]) via at least one of the optical interfaces of the contacting module and one of the optical deflection elements, with the second position (x2, y2, z2) being defined by virtue of the fact that the optical signal is coupled with a maximum degree of coupling, with the degree of coupling being determined by means of at least one electrical signal which is transferred via at least one electrical interface. If a plurality of optical interfaces are respectively coupled in the second alignment step, then the mean value of the degree of coupling from the plurality of optical interfaces can be used for further considerations.

The scanning region can be understood as meaning the generally spatially formed region in which the scan takes place The scanning region can be planar in a special case and line shaped as a special case of this special case. Mathematically, the scanning region can be defined as the smallest convex polyhedron containing all scanning positions (xs[i], ys[i], zs[i]). The scanning region can advantageously be provided two-dimensionally, and the polyhedron can be degenerated into a polygon in this case. As running index i=1, 2, ..., imax, the index i can be provided for consecutive numbering of the scanning position. This may predetermine the temporal sequence of the scanning positions. However, the scanning positions may also be defined adaptively. This may mean that the position P[i+1] is only defined at the run time of the scan by taking account of the degrees of coupling at the scanning positions P[1] to P[i]. The scanning field may be understood as meaning a z-projection of the scanning region on the xy-plane of the wafer. In general, the scanning field can be two-dimensional (i.e., planar), one-dimensional (i.e., line-shaped) as a special case, and zero-dimensional (i.e., punctiform) as a special case of the special case. The xy-extent of the contact pads can be understood as meaning their geometric extent in the x- and y-directions. The scanning field being smaller than an xy-extent of the contact pads may mean that the needle tips do not leave the respectively assigned contact pad during the scan. The scan may be line-shaped in a special embodiment; this corresponds to one-dimensional scanning region. The scan can be line-shaped in the z-direction in a special case of this special embodiment. The scanning field can then be punctiform. The advantage thereof may be that a scan is possible even in the case of very small contact pads.

A degree of coupling k[i] can be determined at each of the scanning positions P[i]. The second position (x2, y2, z2) can be an interpolated maximum position of the degrees of coupling determined at the scanning positions. As an alternative, the second position can be taken without interpolation to be the scanning position at which the maximum degree of coupling was measured. The determined second position (x2, y2, z2) can, but need not, be approached at the end of the second alignment step.

According to the invention, in a third alignment step, the first of the chips is brought into a third position (x3, y3, z3) by virtue of the x3- and y3-coordinate of the positioning stage being initially set and said positioning subsequently being moved in the z-direction toward a third distance c, which is shorter than the second distance b, with the needle tips abutting against the contact pads with a predetermined contact force, the third position (x3, y3, z3) having been calculated from the second position and the coupling angle α of the relevant optical deflection element for the third distance c prior to the third alignment step.

The third position (x3, y3, z3) may be determined by virtue of a maximum degree of coupling being present for the third distance, which is assigned to the coordinate z3, at the point with coordinates x3, y3. The third distance c can be a predetermined optical working distance, at which the needles abut against the contact pads with a given contact force.

By way of example, the third position can be calculated as outlined below: WLOG, the beam deflected by a deflection element through the specific coupling angle α may be in a xz-plane (i.e., perpendicular to y). Then, the third position (x3, y3, z3) can be determined as $x3=x2+(z3-z2)\tan\alpha$ and $y3=y2$, where the coordinate z3 may be defined by virtue of the given working distance c being present there.

As described below, the required working distance c (and hence the coordinate z3) may change overtime.

In the third position, electrical or optical signals can hereafter be guided by the respectively assigned interfaces for the purpose of testing the optoelectronic chip.

Advantageously, a positional difference arising from the first position and the second position of the first of the chips is stored as an offset and taken into consideration when adjusting more of the chips after these were positioned relative to the contacting module in a first position.

Especially to take account of the wear of the needle tips, it is advantageous if the optical working distance c, at which the needles abut against the contact pads with a specified contact pressure, is monitored and if the third position is corrected should the contact force change.

By virtue of the long-term changes in the optical working distance c being determined over the use duration of the contacting module, it is advantageously possible for the needles of the contacting module to be replaced by new needles for the purposes of carrying out the method when the optical working distance c drops below a specified minimum distance.

By virtue of the optical signals advantageously swamping the respective interface during the input coupling, positional tolerances of the optical interfaces of the chips among themselves are compensated in particular.

It is even more advantageous if the optical signals guided via the respectively assigned interfaces have a top hat distribution, when input coupled, for their radiation intensity.

Advantageously, the third alignment step may immediately follow the second alignment step. The processing time can be minimized as a result. Likewise advantageously, a fourth alignment step may be provided between the second and third alignment step and the positioning stage is moved away therein to a fourth distance d in the −z-direction (i.e., in the negative z-direction), with the fourth distance d being greater than the maximum distance l of the needle tips from the contacting module. This can reduce scratching on the pads.

Advantageously, the scanning positions (xs[i], ys[i], zs[i]) may be located in an xy-plane (x, y, z2) in the second alignment step. The scanning positions Ps[i] can then be (xs[i], ys[i], z2).

Likewise advantageously, the scanning positions (xs[i], ys[i], zs[i]) may be located in a yz-plane (x2, y, z) in the second alignment step. The scanning positions Ps[i] can then be (x2, ys[i], zs[i]). The scanning positions can advantageously be chosen such that z increases monotonically, which is to say $z[i+1] \geq z[i] \forall i \in \{1, 2, \ldots, imax-1\}$.

Likewise advantageously, the scanning positions (xs[i], ys[i], zs[i]) may be located on a line (x2, y2, z) in the second alignment step. The scanning positions Ps[i] can then be (x2, y2, zs[i]). In this case, an alignment with respect to y can be dispensed with.

Advantageously, at least one of the optical elements of a chip can comprise an electro-optic sensor and/or an electro-optic actuator and/or an electro-optic modulator. An electro-optic element may be contacted electrically via two electrical interfaces. It may likewise be possible for one of the electrical interfaces to be replaced by a substrate contact (ground contact). When such a ground contact is used, one electrical interface of the electro-optic element may be sufficient for the method. By way of example, the anode of an electro-optic element may be grounded and only the cathode may be guided via one of the electrical interfaces, or vice versa.

Advantageously, the electro-optic sensor may be designed as a photodiode or a phototransistor. Then, the degree of coupling may be determined in the second alignment step by virtue of the light being coupled into the deflection element assigned to the optical sensor via the optical interface of the contacting module and a photocurrent being measured by the corresponding electrical interfaces. The degree of coupling can be determined from the ratio of the photocurrent to the radiant flux output by the contacting module at the interface.

Advantageously, the electro-optic actuator may be in the form of a light-emitting diode (LED) or a laser diode. A light-emitting diode may be in the form of a conventional light-emitting diode or in the form of a superluminescent diode. In the case of an electro-optic actuator, the degree of coupling may be determined in the second alignment step by virtue of an operating current being supplied to the electro-optic actuator via electrical interfaces, whereby the actuator generates light. The generated light is supplied to the optical interface of the contacting module via the assigned deflection element and the incident luminous energy is measured. The degree of coupling can be determined from the ratio of the photocurrent to the radiant flux output by the optical element at the interface. The operating current of the optical element can be used as a measure for the optical radiant flux.

Advantageously, the electro-optic modulator may be designed as a Mach-Zehnder interferometer. In this case, the degree of coupling can be measured via two optical interfaces. Advantageously, the interferometer can be switched into a conducting state in the process, via a voltage applied to the corresponding electrical interfaces.

Advantageously, at least one optical actuator can be operated as a sensor in the second alignment step. By way of example, an LED or laser diode can be operated as a photodiode. This may be advantageous in that no operating current, but only a comparatively low photocurrent, needs to be conducted via the electrical contacts for the purpose of determining the degree of coupling.

EXEMPLARY EMBODIMENTS

Figure 1B:
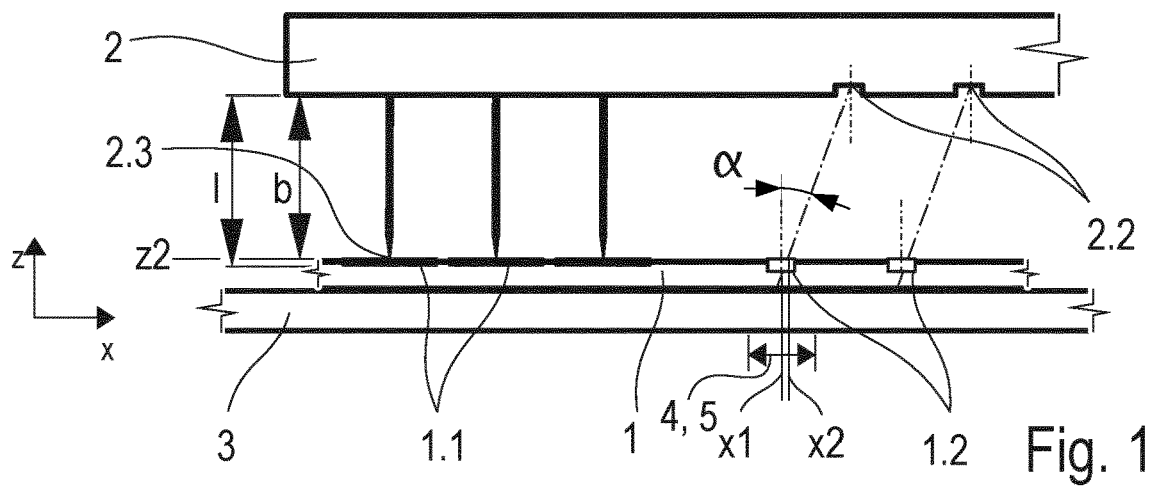
Figure 1C:
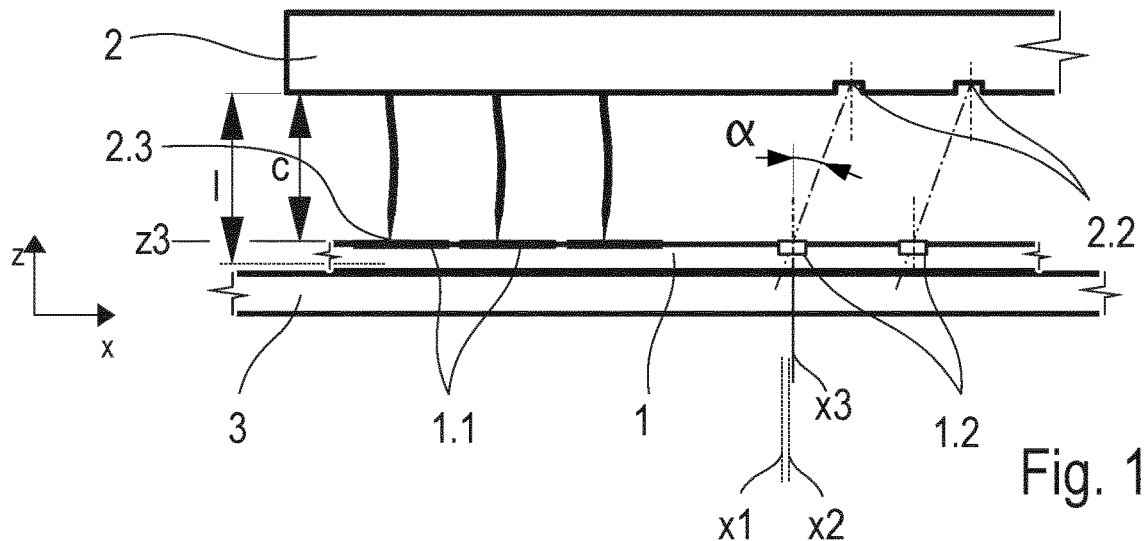
Figure 2A:
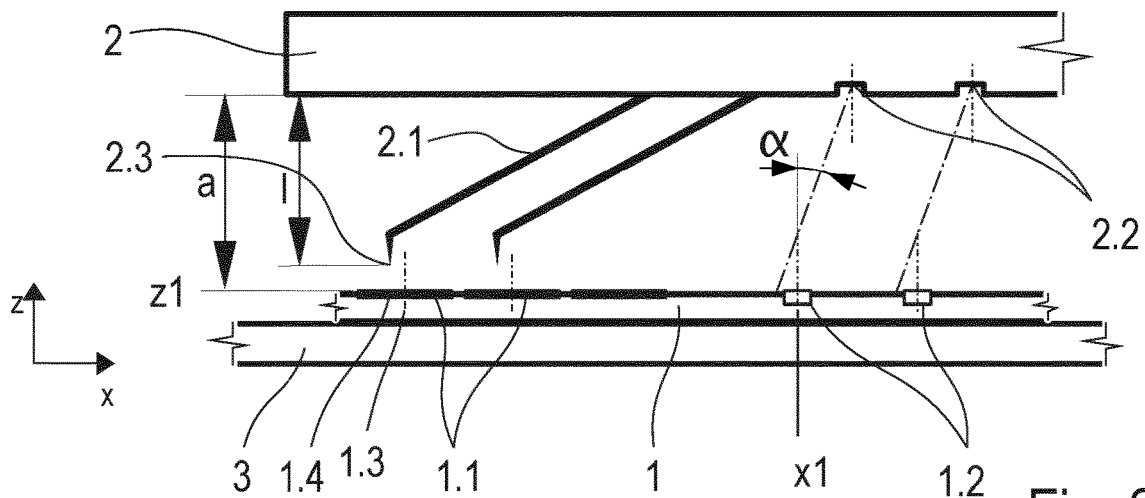
Figure 2B:
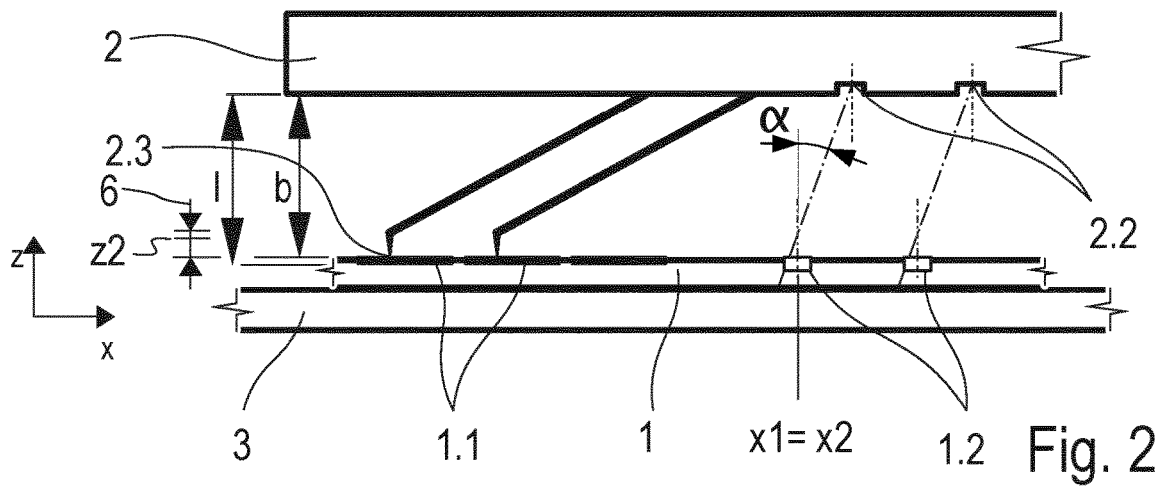
Figure 2C:
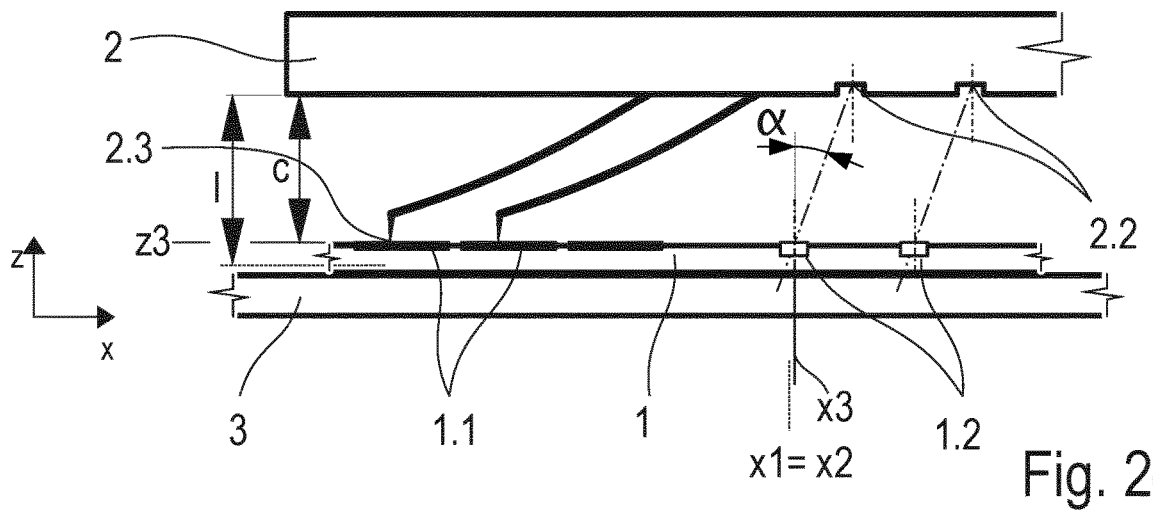
Figure 3:
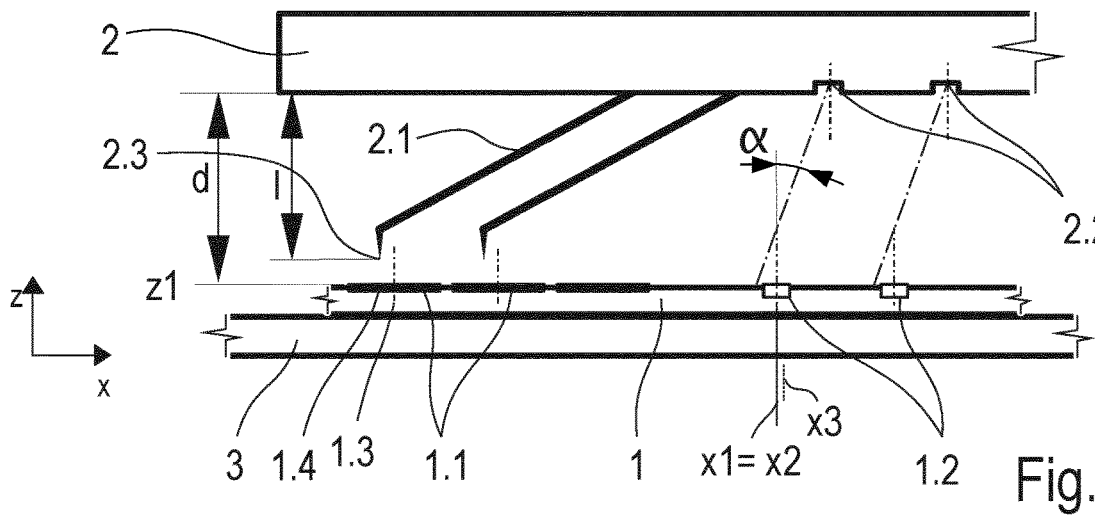
Figure 4:
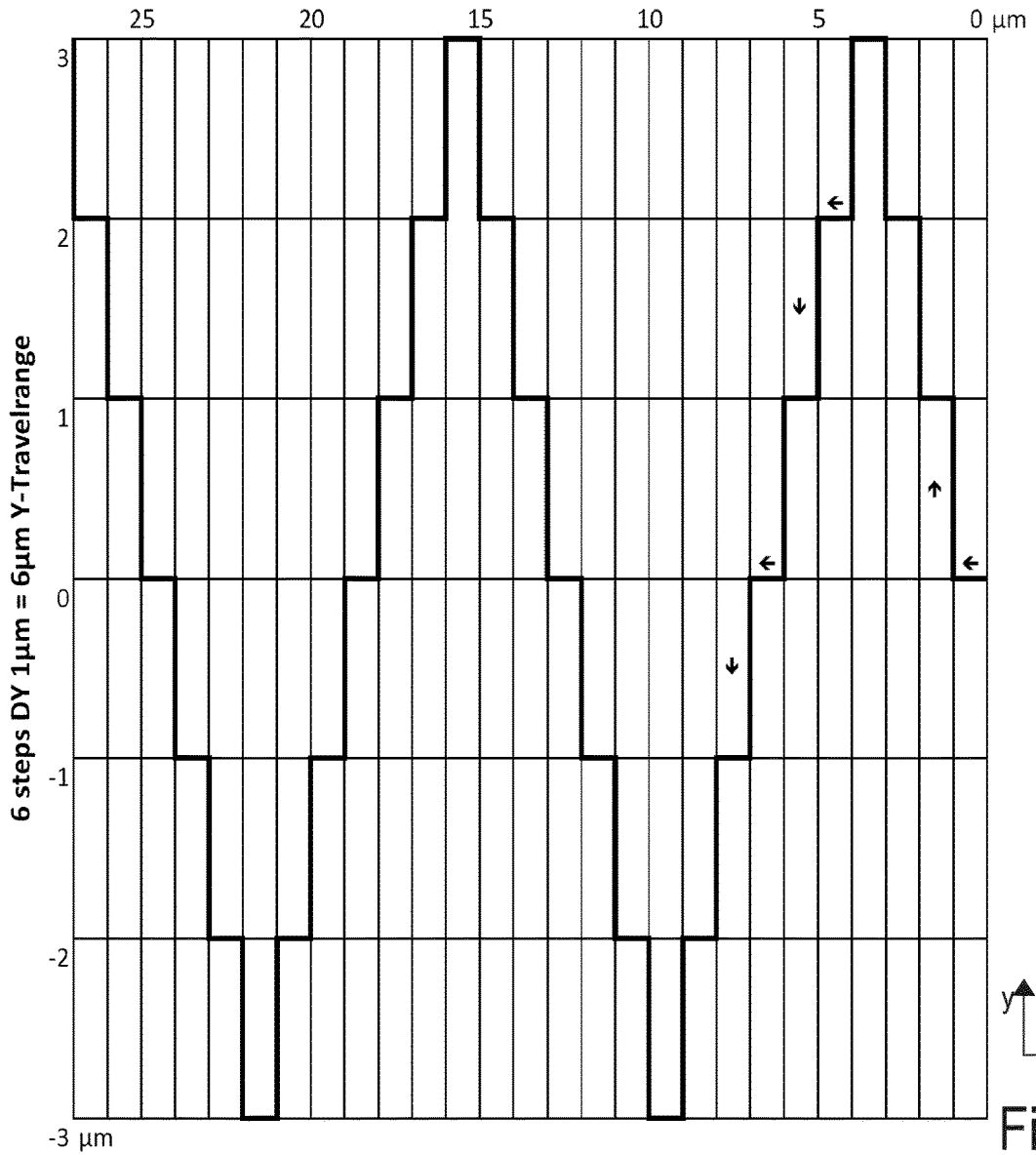
Figure 5:
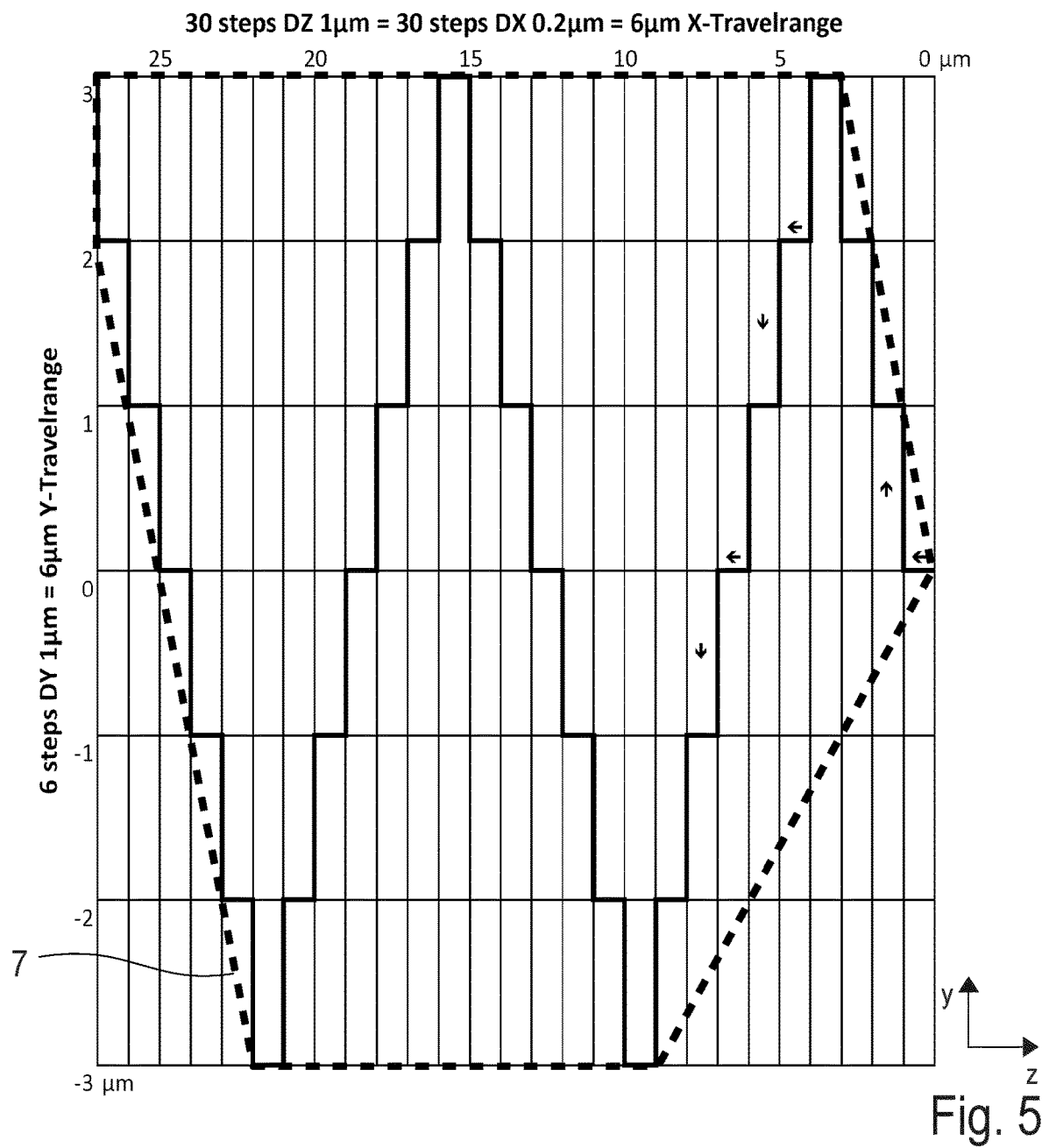

The intention is to explain the invention in more detail hereinafter on the basis of exemplary embodiments and with the aid of drawings. In this respect:

FIG. 1a shows a chip of a first exemplary embodiment after the first alignment step, arranged in a first position vis-à-vis the contacting module, FIG. 1b shows the first exemplary embodiment during the second alignment step, FIG. 1c shows the first exemplary embodiment after the third alignment step, FIG. 2a shows a chip of a second exemplary embodiment after the first alignment step, arranged in a first position vis-à-vis the contacting module, FIG. 2b shows the second exemplary embodiment during the second alignment step, FIG. 2c shows the second exemplary embodiment after the third alignment step, FIG. 3 shows the fourth step of a modification of the second exemplary embodiment, FIG. 4 shows a scanning rule during the second alignment step, and FIG. 5 shows the associated scanning field.

Optoelectronic chips 1 arranged on a wafer and having electrical interfaces in the form of contact pads 1.1 and optical interfaces which are fixedly arranged in relation to said electrical interfaces and which are the form of optical deflection elements 1.2, for example grating couplers or mirrors, with a specific coupling angle α are tested using a method according to the invention. The specific coupling angle α represents an angle which an optical signal or its central ray includes with a normal of the chip 1. It is typically greater than 0° and less than 25°. By way of example, a typical value for the specific coupling angle α in air is 11.6° and relates to the optical fibers with a corresponding polished wedge section, which are used for coupling purposes in the final application of the chip.

In this case, like a method from the prior art, a wafer is accommodated by a positioning stage 3 which is adjustable vis-à-vis a contacting module 2 in the x-, y- and z-direction of a Cartesian coordinate system and which is rotatable about the z-axis. In addition to electrical interfaces 2.1 assignable to the chips 1, the contacting module 2 also comprises optical interfaces 2.2 assignable to said chips. The electrical interfaces and the optical interfaces of the chips 1 are produced on the wafer in different method steps, with the result that they only have small positional tolerances with respect to one another in each case, but the arrangements formed by the electrical interfaces may have tolerance deviations vis-à-vis the arrangements formed by the optical interfaces, especially from wafer to wafer. The same applies to the tolerances of the contacting module. Moreover, the coupling angle α may be afflicted by tolerances. In particular, the coupling angle may differ from wafer to wafer on account of tolerances.

In a first alignment step, the wafer is moved toward the contacting module 2 in such a way that the electrical interfaces which are present on the contacting module 2 and are in the form of needles 1.1 are arranged at a first position (nominal position) of a first of the chips 1, perpendicularly above predetermined points 1.4 which correspond to the centers 1.3 of the contact pads 1.1. During the adjustment, the contacting module has an adjustment distance a in the z-direction, which is greater than the free length l of the needles 2.1 to the chip 1, with the result that there cannot be contact between the needle tips of the needles 2.1 and the contact pads 1.1. This corresponds to a first position (x1, y1, z1) at a z-coordinate z1. In this respect, see FIG. 1a, wherein, like in the other figures as well, the illustration of the adjustment in the y-direction has been dispensed with here for the sake of simplicity. Accordingly, travels during individual adjustment steps are only depicted as travels in the x-direction. In a modification of this exemplary embodiment not depicted in the figure, the predetermined points are arranged at a distance from the centers of the contact pads.

This first adjustment step advantageously progresses according to a fixed routine known from practice. In this case, one camera measures the needles 2 by focusing on the needle tips and a second camera measures the contact pads 1.1 of the chip 1. Both cameras have previously been referenced to one another by way of a standard. This subsequently allows the accurate calculation of the optimal position (nominal position) of the needles 2 in relation to the contact pads 1.1 and hence the positioning of the contact module 2 with respect to the chip 1. This is usually implemented by way of regression and extrapolation of the measurement values. Moreover, a contact pad 1.1 is also expected as a counterpiece for each needle 2 found. As a rule, the user will not intervene in this routine. Additionally, alternative structures such as alignment marks, etc., usually cannot be used for the positioning. The cameras are used not only to correct the xy-position and a twist about the z-axis but also to determine the z-position. Reference points for the needles 2.1 are the needle tips 2.3 thereof.

It is clear to a person skilled in the art that, due to positional tolerances of the needle tips 2.3 with respect to one another and of the centers of the contact pads 1.1 with respect to one another, it is not really possible to simultaneously arrange all needle tips exactly above the centers of the contact pads 1.1, and, ultimately, a position is set in which the mean deviation is the smallest. However, the positional tolerance of the electrical interfaces with respect to one another are negligibly small in comparison with the positional tolerance of the arrangement of the electrical interfaces to the arrangement of the optical interfaces of a chip 1, the cause of which, in particular, can be found in the fact that the electrical interfaces and the optical interfaces are produced in succession using different process steps. The same applies to the tolerances of the contacting module. Moreover, the coupling angle α may be afflicted by tolerances. In particular, the coupling angle may differ from wafer to wafer on account of tolerances.

Since the production of the electrical interfaces and the production of the optical interfaces are implemented in a respective method flow for all chips on a wafer, the positional deviation between the arrangements of the electrical interfaces and the arrangements of the optical interfaces of individual chips on a wafer is at least approximately the same.

Once the arrangement of the electrical contacts of the chip 1 (needles 2.1) has been aligned with respect to the electrical contacts of the contacting module 2 (contact pads 1.1), the actual position of the optical interfaces of the chip with respect to the optical interfaces on the contacting module 2.2 deviates from an intended position for various reasons; see FIG. 1a.

Firstly, the position of the optical interfaces on the chip 1 deviate on each wafer from their target positions in the x-, y- and z-directions and about the z-direction with statistical fluctuations, but the deviations about the x-direction and about the y-direction can be assumed to be unchanged as a result of the alignment of the positioning stage 3 after the chip 1, and hence the wafer, has been fixed in its position (systematic deviations). Moreover, the coupling angle may deviate from a target angle.

Secondly, the position of the optical interfaces on the contacting module 2.2 deviates from a target position in relation to the needles 2.1; this deviation depends on the assembly accuracy of the optical module, which is an integral constituent part of the contacting module. This relates not only to positional deviations in the x-, y- and z-direction, but also to tilts about the z-direction, and about the x- and the y-direction. All 6 parameters are assembly-dependent, systematic deviations.

Thirdly, there are changeable deviations over the service life of the contacting module 2. The reason for this lies in the mechanical wear, and hence the change in shape, of the needle tips and possible bending and the change in the fit result emerging therefrom.

By way of the camera measurement, the positioning stage 3 de facto corrects the position of the entire contacting module 2 with respect to the chip/wafer accordingly—and hence also changes the position of the arrangement of the optical interfaces of the contacting module 2.2 with respect to the arrangement of the optical interfaces on the chip 1 on account of the specific coupling angle of the respective optical deflection element, in particular a grating coupler.

Proceeding from the first position (x1, y1, z1), a second position (x2, y2, z2) is determined in a second alignment step (in this respect, see FIG. 1b). To this end, the positioning stage (3) is initially moved toward the contacting module (2) to a second distance (b) in the z-direction, at which the needle tips (2.1) abut the contact pads (1.1). As a result of this, electrical signals are transferable by way of the interfaces respectively assigned to one another and optical signals are transferable by way of the optical interfaces respectively assigned to one another. Now, in the second alignment step, there is a relative alignment of the optical deflection elements (1.2) with respect to the optical interfaces (2.2) present on the contacting module (2). In this case, in a scanning field (4, 5) smaller than an xy-extent of the contact pads (1.1), the positioning stage (3) is deflected into scanning positions Ps[i]=(xs[i], ys[i], z2) in the x-direction (4) and/or y-direction (5) within a scanning region (4, 5) with respect to the x- and/or y-coordinates of the first position. Thus, the scan is implemented in an xy-plane. In a further development of the example not depicted in the figures, the scan can also comprise a movement in the z-direction; by way of example, the scan can be implemented in a yz-plane.

An optical signal is coupled at the scanning positions (xs[i], ys[i], zs[i]) via at least one—in this case two—of the optical interfaces of the contacting module (2.2) and one of the optical deflection elements (1.2).

The second position (x2, y2, z2) is defined in that the optical signal is coupled with a maximum degree of coupling, wherein the degree of coupling is determined by means of at least one electrical signal that has been transferred via at least one electrical interface (1.2, 2.1). Two of the three depicted electrical interfaces are used for a photodiode. Alternatively, one of the two utilized interfaces can be replaced by a substrate contact of the wafer. If a plurality of optical interfaces are coupled at the same time, then the mean value of the degree of coupling from a plurality of interfaces can be used for further considerations.

In the illustration, the second position is at the x-coordinate x2, which differs from x1. In this respect, see FIG. 1b. The second position need not be approached; it is sufficient for the latter to be determined from the degrees of coupling at the scanning positions, for example by means of a regression.

In a third alignment step, the first of the chips (1) is brought to a third position (x3, y3, z3) by virtue of the x3- and y3-coordinates of the positioning stage initially being set, and the latter subsequently being moved in the z-direction to a third distance c, which is shorter than the second distance b. In this case, the needle tips (2.3) abut the contact pads (1.1) with a predetermined contact force, as depicted in FIG. 1c. This is achieved by virtue of the optical working distance being chosen to be smaller than the free length of the needles 1. The difference is referred to as overtravel or else overdrive. In the process, the needles may for example be bent or deflected elastically. An elastic bend has been depicted here in exaggerated fashion in order to elucidate the effect. A smaller overtravel is selected in the second alignment step in comparison with the third alignment step. The second distance b is greater than the third distance c. As a result, the contact pads can be spared during the scan.

The overtravel ensures a reliable electrical contact of the needles with the contact pads (lower contact resistance). Following the first slight contact of the needles with the contact pads, the wafer is still driven upwardly in the third alignment step by a few 10 μm in the z-direction. This achieves two things. Firstly, this makes it possible to break through possibly present oxide surfaces, with the result that a reproducible, low-resistance contact is achieved. Secondly, the overtravel generates a constant contact pressure of the needles since the needles deflect accordingly on account of the additional travel and exert a contact pressure on the contact pad. This contact pressure differs depending on the utilized type of needle; however, a value of the order of approximately 0.03 N per needle can be assumed. Overtravel is typically specified in multiples of MIL (American, 1 mil=¹⁄₁₀₀₀ inches=0.0254 mm).

In the case of a contacting module in which the arrangement of the needle has a fixed position vis-à-vis the optical interfaces, it is necessary to take the value of the overtravel into account during the final adjustment of the chip so that, in the contacted state, it is ensured that an optical working distance between the optical interfaces of the contacting module and the chip is provided, for which there is maximum input coupling of the optical signals. The third position (x3, y3, z3) is already calculated prior to the third alignment step from the second position and the coupling angle ($\alpha$) of the relevant optical deflection element (1.2) for the third distance (c). As a result, it is possible to initially set the x- and y-coordinates of the third position and subsequently move the z-coordinate to the desired working distance c. This prevents the needles from scratching the pads.

The chip is brought into the third position in order to set the optical working distance c. In the latter, the final adjustment state is established; in it, both the electrical and the optical interfaces of the chip and contacting module are aligned to the best possible extent with respect to one another, which is to say there is a best-possible measurement capability of the optical signal flow (maximum position of the optical coupling), with the electrical signal flow also being given. To test the chip, electrical and optical signals are subsequently guided over the interfaces respectively assigned to one another.

The adjustment path from the first position (nominal position) to the third position (maximum position of optical coupling) represents an offset (depicted in FIG. 1c as a coordinate comparison of the coordinates x3 with respect to x1 and x2 and as coordinate z3) which is advantageously stored and also taken into account when adjusting all further chips on this wafer. That is to say, the nominal position of the positioning stage is corrected by the corresponding offset as difference x3−x1 in the x-direction (see FIG. 1c) and as difference y3−y1 in the y-direction (not depicted here). However, this assumes a corresponding, still tolerable displacement of the needles over the contact pads.

This procedure only needs to be carried out once per wafer or else only after relatively long time intervals.

Moreover, this offset value, which is to say the difference x3−x1 and the difference y1−y1, and its changes over time can be observed, and this allows statements to be made about the wear and hence the linked change of the needles.

To increase the accuracy of the determination of the offset, the scan may also be carried out on a plurality of chips of the wafer before the testing of all the chips of the wafer is started, and the results can be averaged.

The required overtravel, which is to say the difference c−l, may change over the service life of the contacting module on account of a "running-in" or wear of the needles, whereby the working distance c is reduced.

Direct monitoring of the optical working distance is important in order to ensure the defined optical coupling properties between the contacting module and the chip (measurement capability) and in order to prevent collisions between the optical interfaces of the contacting module and of chips (a few 10-100 µm spacing during operation).

A distance sensor, for example a capacitive distance sensor, securely integrated in the contacting module can be used to this end. The latter allows the real optical working distance to be monitored. In combination with an active control, the working distance can be actively regulated by displacing the positioning stage in the z-direction, and a hard stop for dropping below a minimum working distance can be programmed where necessary, for example in order to prevent a collision as a result of a maloperation by the operator.

Typically, a change in the needle tip positions is to be expected during the first use of the contacting module (run-in behavior). This can be anticipated by a multiple contact simulation prior to the adjustment for a first chip (pre-aging), whereby the value of the offset to be set can be reduced.

Usually, all optical interfaces of the chips, embodied by grating couplers, have coupling angles with an identical angular value and an identical orientation, with the result that a change in the optical working distance $\Delta b$ accordingly yields an identical relative change $\Delta X$ of the optimal coupling position for all optical interfaces.

Typically, the change in the optical working distance $\Delta b$ is in the range of <50 µm. In the case of a change in the optical working distance of for example 10 µm and a coupling angle $\alpha$ of 11.6° in the xz-plane, there would thus be a change in the optimal coupling position $\Delta x$ of 2 µm in the x-direction. In the case of a change of the optical working distance $\Delta b$ of 20 µm, there would be a change in the optimal coupling position $\Delta x$ of 4 µm in the x-direction. This can still be absorbed by the above-described correction; i.e., the positioning stage is post-corrected in the x-direction by a control command, under the assumption that the needles still strike the contact pads sufficiently reliably.

The requirements in respect of the accuracy of the adjustment steps can be reduced if the optical signals which are guided over the respectively assigned interfaces for the purposes of testing the chips swamp the input-coupling interface in each case.

FIG. 2a shows a chip of a second exemplary embodiment after the first alignment step, arranged in a first position vis-à-vis the contacting module. In contrast to the first exemplary embodiment, cantilever needles 2.1 are used in this case. In a first alignment step, the wafer is moved toward the contacting module (2) in such a way that the needle tips (2.3) are arranged in a first position (x1, y1, z1), in each case with a spacing in the z-direction above a predetermined point (1.4) of the assigned contact pad (1.1) of a first of the chips (1), the contacting module (2) being at a first distance (a) from the first chip (1) in the z-direction and the first distance (a) being greater than a maximum distance (l) of the needle tips (2.3) from the contacting module (2). The predetermined points 1.4 are in this case provided away from the centers 1.3 of the contact pads 1.1.

FIG. 2b shows the second exemplary embodiment during the second alignment step. In contrast to the first exemplary embodiment, a yz-scan over a scanning region in the y-direction 5 and z-direction 6 with a fixed coordinate x2=x1 is provided in this case. In this case, the scan can advantageously be terminated once the maximum degree of coupling has been exceeded at z2. In a modification of the second exemplary embodiment, the scan is implemented at a fixed y-coordinate y2=y1; in this case, this is a line scan. In a further modification, the scan is implemented in an xy-plane with a fixed z-coordinate.

FIG. 2c shows the second exemplary embodiment after the third alignment step. In the case of the cantilever needles, the compression force can be applied by means of elastic bending. The third alignment step immediately follows the second.

FIG. 3 shows a fourth alignment step of a further modification of the second exemplary embodiment. Here, the positioning stage is moved away to a fourth distance d in the −z-direction, with the fourth distance d being greater than the maximum distance l of the needle tips (2.3) from the contacting module (2). The fourth alignment step is implemented between the second and third alignment step.

FIG. 4 shows a scanning rule for a yz-scan during the second alignment step. The abscissa plots the z-coordinate of the trajectory of the scan minus the coordinate z2 of the second position. The ordinate plots the y-coordinate of the trajectory of the scan minus the coordinate y2 of the second position. The trajectory (yz-path) is depicted as a thick line in the diagram; the direction of travel along said trajectory is indicated by arrows. In this case, the scanning positions are successively chosen at the corners of the plotted trajectory. In the illustration, the scan starts center right at the second position (x2, y2, z2). 55 scanning positions are used. The z-coordinate increases monotonically in 54 steps, alternately by 1 µm and 0 µm. The y-coordinate moves in the manner depicted between y2−3 µm and y2+3 µm with increments of −1 µm, 0 µm, and 1 µm. The scanning range is 6 µm in the y-direction and 27 µm in the z-direction. In the case of a specific coupling angle α=11.6°, the path of 28 µm in the z-direction is equivalent to a beam offset of 5.5 µm in the x-direction. The scanning region 7 depicted in FIG. 5 is the bounding polygon of the scanning positions. It has a planar form in a yz-plane. The scanning field (not depicted in the figure) as a perpendicular z-projection of the scanning region would in this case run one-dimensionally (in line-shaped fashion) in the y-direction.

In a modification (not depicted in the figure) of the scanning rule depicted in FIGS. 4 and 5, the y-coordinate remains fixed, and the scan is implemented as a line scan in the z-direction. Then the scanning field would be puncti-form.

LIST OF REFERENCE SIGNS

1 Chip
1.1 Contact pad
1.2 Optical deflection element
1.3 Center of the contact pad
1.4 Predetermined point
2 Contacting module
2.1 Needle
2.2 Optical interface on the contacting module
2.3 Needle tip
3 Positioning stage
4 x-scanning region
y-scanning region
6 z-scanning region
7 Scanning region
α Coupling angle
a First distance
b Second distance
c Third distance
l Free length of the needle

The invention claimed is:

1. A method for testing optoelectronic chips arranged on a wafer and having electrical interfaces in the form of contact pads and optical elements which are fixedly arranged in relation to said electrical interfaces and which comprise optical interfaces in the form of optical deflection elements with a specific coupling angle (α),
wherein the wafer is accommodated by a positioning stage which is adjustable vis-à-vis a contacting module in the x-, y-, and z-direction of a Cartesian coordinate system and which is rotatable about the z-axis, the contacting module having electrical interfaces in the form of needles with needle tips assigned to the contact pads and optical interfaces assigned to the optical deflection elements, and
in a first alignment step, the wafer is moved toward the contacting module in such a way that the needle tips are arranged in a first position, in each case with a spacing in the z-direction above a predetermined point of the assigned contact pad of a first of the chips, the contacting module being at a first distance (a) from the first of the chips in the z-direction and the first distance (a) being greater than a maximum distance of the needle tips from the contacting module,
proceeding from the first position, a second position is determined in a second alignment step by virtue of the positioning stage being moved toward the contacting module at a second distance in the z-direction, in which the needle tips abut against the contact pads such that electrical signals are transferable via the respective interfaces assigned to one another and optical signals are transferable via the respective optical interfaces assigned to one another, with a relative alignment of the optical deflection elements with respect to the optical interfaces present on the contacting module being implemented in the second alignment step by virtue of, in a scanning field smaller than an xy-extent of the contact pads, the positioning stage being deflected in the x- and/or y-direction with respect to the x- and/or y-coordinates of the first position and/or being moved in the z-direction toward scanning positions Ps[i]=(xs[i], ys[i], zs[i]) within a scanning region, and an optical signal being coupled at the scanning positions via at least one of the optical interfaces of the contacting module and one of the optical deflection elements, with the second position being defined by virtue of the fact that the optical signal is coupled with a maximum degree of coupling, with the degree of coupling being determined by means of at least one electrical signal which is transferred via at least one electrical interface, and
in a third alignment step, the first of the chips is brought into a third position by virtue of the x3- and y3-coordinate of the positioning stage being initially set and said positioning stage subsequently being moved in the z-direction toward a third distance c, which is shorter than the second distance b, with the needle tips abutting against the contact pads with a predetermined contact force, the third position having been calculated from the second position and the coupling angle (α) of the relevant optical deflection element for the third distance (c) prior to the third alignment step.

2. The method for testing optoelectronic chips arranged on a wafer as claimed in claim 1, wherein the third alignment step immediately follows the second alignment step or in that a fourth alignment step is provided between the second and third alignment step and the positioning stage is moved away therein to a fourth distance d in the −z-direction, with the fourth distance d being greater than the maximum distance l of the needle tips from the contacting module.

3. The method for testing optoelectronic chips arranged on a wafer as claimed in claim 1, wherein the scanning positions are located in an xy-plane and/or on a line and/or in a yz-plane in the second alignment step.

4. The method for testing optoelectronic chips arranged on a wafer as claimed in claim 1, wherein a positional difference arising from the first position and the second or the third position of the first of the chips is stored as an offset and taken into consideration when aligning more of the chips after these were positioned relative to the contacting module in a first alignment step.

5. The method for testing optoelectronic chips arranged on a wafer as claimed in claim 1, wherein the third distance c, at which the needles abut against the contact pads with a specified compression force, is monitored and the third distance is corrected in the case of changes in the compression force.

6. The method for testing optoelectronic chips arranged on a wafer as claimed in claim 1, wherein the long-term change in the third distance c is determined over the use duration of the contacting module and the needles of the contacting module are replaced by new needles for the purposes of carrying out the method when the third distance c drops below a specified minimum distance.

7. The method for testing optoelectronic chips arranged on a wafer as claimed in claim 1, wherein the optical signals transmitted via the mutually assigned interfaces swamp one of the interfaces when input coupled therein.

8. The method for testing optoelectronic chips arranged on a wafer as claimed in claim 1, wherein the optical signals transmitted via the mutually assigned interfaces have a top hat distribution of their radiation intensity when input coupled into one of the interfaces.

9. The method for testing optoelectronic chips arranged on a wafer as claimed in claim 1, wherein at least one of the optical elements of a chip comprises an electro-optic sensor and/or an electro-optic actuator and/or electro-optic modulator.

10. The method for testing optoelectronic chips arranged on a wafer as claimed in claim 9, wherein the electro-optic sensor is designed as a photodiode or phototransistor and/or in that the electro-optic actuator is designed as a light-emitting diode or a laser diode or in that the electro-optic modulator is designed as a Mach-Zehnder interferometer.

11. The method for testing optoelectronic chips arranged on a wafer as claimed claim 9, wherein at least one optical actuator is operated as a sensor in the second alignment step.

* * * * *